United States Patent [19]

Morris

[11] Patent Number: 4,813,764
[45] Date of Patent: Mar. 21, 1989

[54] DEVICE FOR EDITING A REPRODUCTION

[76] Inventor: Tedd E. Morris, 5161 Verde Valley, #1041, Dallas, Tex. 75240

[21] Appl. No.: 44,586

[22] Filed: Apr. 30, 1987

[51] Int. Cl.[4] ............................................. G02B 27/18
[52] U.S. Cl. .................................... 350/235; 355/113; 362/3
[58] Field of Search ...................... 350/235, 236, 237; 355/21, 67, 69, 113; 362/3

[56] References Cited

U.S. PATENT DOCUMENTS

| | | | |
|---|---|---|---|
| 2,403,892 | 7/1946 | McFarlane et al. | 355/21 |
| 2,719,469 | 10/1955 | Sanford | 362/3 |
| 3,217,115 | 3/1964 | Yellott et al. | 350/235 |
| 3,263,584 | 8/1966 | Knus | 355/67 |
| 3,451,321 | 6/1969 | Raia et al. | 355/21 |
| 4,493,541 | 1/1985 | Goetschi | 355/113 |
| 4,593,998 | 6/1986 | Moss et al. | 355/21 |

Primary Examiner—John K. Corbin
Assistant Examiner—Martin Lerner
Attorney, Agent, or Firm—Harry C. Post, III

[57] ABSTRACT

A device for and method of editing a reproduction to be made by using a diazo process in which the device comprises a portable body adapted to be hand held. The body has a chamber and a port that provides access from the chamber outwardly of the body. An electric light source is disposed in the chamber of the body to provide light through the port with the electric light source having sufficient illumination to expose a light sensitive diazo compound. Electrical power provides power to the electric light source such that light from the electric light source in the body is directed through the port onto the light sensitive diazo compound of any undesired portion of the reproduction prior to developing the reproduction.

1 Claim, 2 Drawing Sheets

DEVICE FOR EDITING A REPRODUCTION

It is well known in the drafting art to use a diazo process to make reproductions, such as blue line, black line, and white print. This process is a reproduction method using diazo material coated with a light sensitive diazo compound, such as diazo paper and sepia intermediates, that, after exposure, is subjected to ammonia vapor or moist development to produce a colored, positive azo dye image. This process is used so that a positive translucent or transparent original produces a positive reproduction.

It is frequently found desirable by draftsman to make changes to or edit the reproductions made by this process. One procedure used to make such changes is to make a duplicate original and to erase the undesired portion from the duplicate original. Erasing the undesired portion may cause damage to the reproduction and will leave a lighter area where the material has been erased than the area where the material has not been erased. Another procedure in making such changes is to make a duplicate original so that the original is preserved, to cut the undesired material out of the duplicate original by using scissors, a razor blade or an "Exacto" type knife, and then to make a reproduction of the cut duplicate original. This procedure requires making a duplicate original, which is expensive and time consuming. Further, lines may be left on the reproduction where the duplicate original was cut, which requires erasing such lines. As previously explained, erasing an undesired portion may cause damage to the reproduction and will leave a lighter area where the material has been erased than the area where the material has not been erased.

Further, it is frequently found desirable to prepare a reproduction with part of the drawing of lighter or darker tone than the remaining portion of the reproduction. For example; reproductions are frequently used of a building in lighter tone, such as halftone or quartertone, and the electrical wiring or piping being untoned or total black or blue line. To obtain this reproduction, the original of the building having a screen is stacked to provide a toned print of the building and the original of the electrical wiring is then stacked on the building and screen. This stack of originals is then photographed to make the reproduction.

Accordingly, it is an object of the pesent invention to provide a device for and method of editing a reproduction that eliminates the need for erasing.

Another object of the present invention is to provide a device for and method of editing a reproduction that eliminates the time and expense in making a duplicate original and cutting such duplicate original.

Another object of the present invention is to provide a device for and method of editing a reproduction having a toned portion.

In accordance with the invention, there is provided a device for editing a reproduction to be made by using a diazo process. The device comprises a portable body adapted to be hand held. The body has a chamber and a port providing access from the chamber outwardly of the body. An electric light source is disposed in the chamber of the body to provide light through the port and has sufficient illumination to expose a light sensitive diazo compound. Electrical power apparatus is connected to the body for providing power to the electric light source such that light from said electric light source in said body may be directed through the port onto the light sensitive diazo compound of any portion of the reproduction prior to developing the reproduction.

Further, in accordance with the invention, there is provided a method of editing a reproduction to be made by using a diazo process. An original is positioned on a material coated with a light sensitive diazo compound and exposed to light to provide a duplicate original reproduction of undeveloped diazo compound. The original is then separated from the material. A portion of the duplicate original reproduction that is not desired to be reproduced is exposed to light to provide an edited duplicate original reproduction of undeveloped diazo compound. The undeveloped diazo compound is developed to provide an edited reproduction of the original.

Further, in accordance with the invention, there is provided a method of editing a reproduction to be made by using a diazo process. A first portion of a material coated with a light sensitive diazo compound is exposed to light to burn off a portion of the diazo compound. An original is postioned on the partially exposed material with the portion of the original to be removed located on the exposed portion of the material. The original and the partially exposed material are exposed to light to provide an edited duplicate original reproduction of undeveloped diazo compound on the material. The original is separated from the material and the unexposed diazo compound on the material is developed to provide an edited reproduction of the original.

Further, in accordance with the invention, there is provided a method of editing a reproduction to be made by using a diazo process. An original to be reproduced is placed on a material coated with a light sensitive diazo compound. The original and the material are exposed to light to provide a duplicate original reproduction of undeveloped diazo compound on the material. The original is separated from the exposed material. A screen is positioned on the portion of the duplicate original reproduction of undeveloped diazo compound that is to be given a tone. The screen and the material are exposed to light. The unexposed diazo material on the material is developed to provide a toned reproduction.

Other objects and advantages of the invention will become apparent upon reading the following detailed description and upon reference to the drawings, wherein like reference characters are used throughout to designate like parts:

Figures 1, 2, 3:
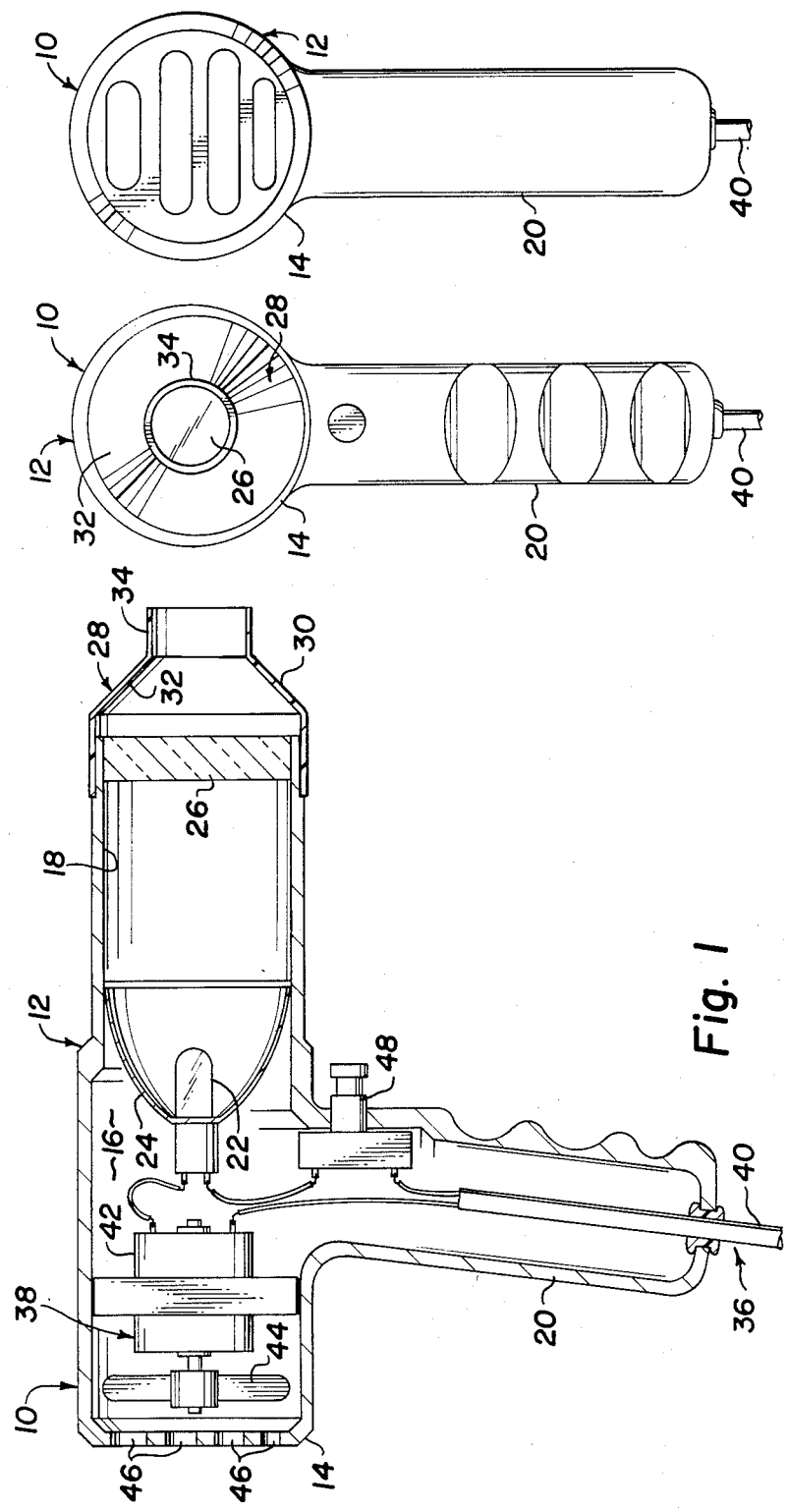
FIG. 1 is a side elevational view of an editing device constructed in accordance with the present invention.
FIG. 2 is a front elevational view of the invention shown in FIG. 1.
FIG. 3 is a back elevational view of the invention shown in FIG. 1.
Figure 4:
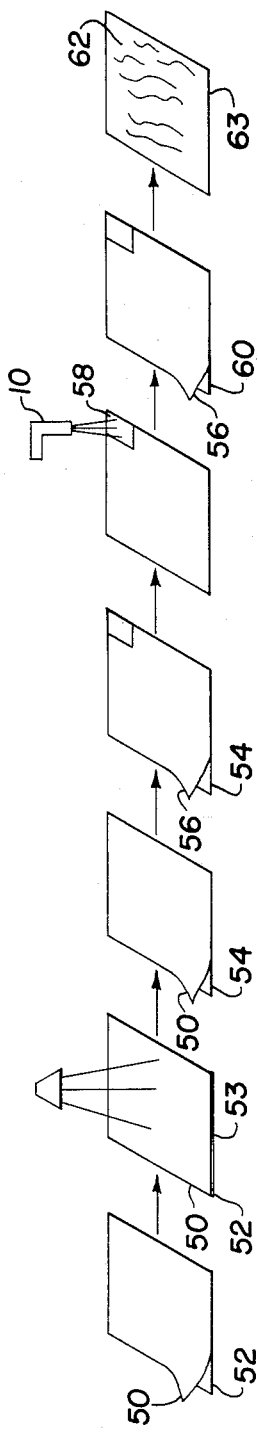
FIG. 4 is a schematic illustration of a method of editing a reproduction using an editing device such as shown in FIGS. 1–3.
Figure 5:
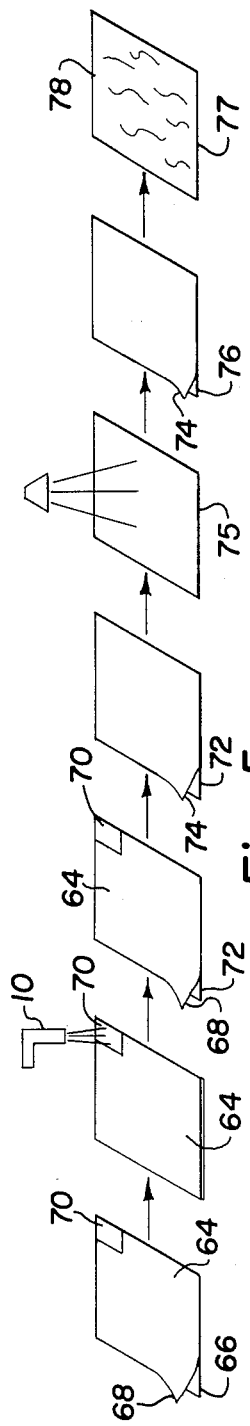
FIG. 5 is a schematic illustration of a second method of editing a reproduction using an editing device such as shown in FIGS. 1–3.
Figure 6:
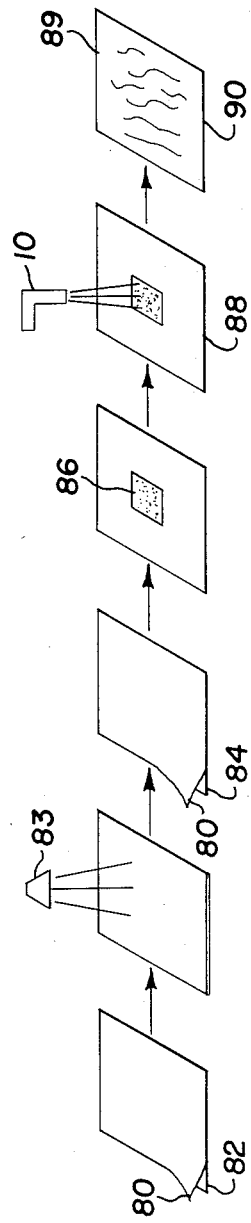
FIG. 6 is a schematic illustration of third method of editing a reproduction using an editing device such as shown in FIGS. 1–3.

Turning to the drawing, there is shown in FIGS. 1–3 a device for 10 for editing a reproduction to be made by using a diazo process constructed according to the present invention.

Editing device 10 comprises a portable body 12, which is adapted to be hand held. Body 12 includes a tubular portion 14 defining a chamber 16 and a port 18 to provide access from chamber 16 outwardly of body 12 and a handle portion 20 connected to tubular portion 14. Handle portion 20 is adapted for a user to hold body 12 of device 10 by hand.

An electric light source 22 is disposed in chamber 16 of body 12 to provide light through port 18. Electric light source 22 is of conventional design and has sufficient illumination to expose a light sensitive diazo compound coating a reproduction material, such as diazo paper and diazo vellum.

Disposed in tubular portion 14 of body 12 is a parabolic reflector 24 for reflecting substantially parallel light rays from light source 22 through port 18.

Also disposed in tubular portion 14 is light collimating apparatus 26 for providing parallel light rays passing through port 18. Light collimating apparatus 26 is a preferably a lens system of conventional design that produces the parallel light rays.

An adapter device 28 is removably connected to body 12 for restricting passage of light through port 18. Adapter device 28 includes a member 30 that extends annularly around port 18 and is connected to tubular portion 14 of body 12. Member 30 has a generally conically shaped portion 32 and an open extension 34 to provide a shoulder to restrict passage of light through port 18.

Electrical power supply apparatus 36 is connected to body 12 for providing power to electric light source 22 and, if desired, to cooling apparatus 38 disposed in chamber 16. Electrical power supply apparatus 36 includes electrical conductors 40 extending through handle portion 20 of body 12. Conductors 40 are connected to cooling apparatus 38, which includes a conventional fan motor 42 connected to fan 44 that draws air through vents 46 provided in the rear end of tubular portion 14 of body 12. A conventional on-off switch 48 is connected to handle portion 20 of body 12 and in series with conductor 36 for selectively activating and deactivating light source 22 such that light from electric light source 22 is directed through port 18.

Hand held device 10 may be employed in several different methods of editing a reproduction to be made by using a diazo process.

One method where hand held device 10 may be employed involves positioning an original 50 on a material 52 coated with a light sensitive diazo compound. Original 50 and material 52 are exposed to light in apparatus that performs the first step 53 in the conventional two step diazo process to provide a duplicate original reproduction 54 of undeveloped diazo compound on the material. After separating original 50 from material 52, the portion of the duplicate original reproduction that is desired to be reproduced may be protected from exposure to light emitted from the hand held device 10 by using a template 56 made from light impermeable material. Original 50 is separated from material 52 and light emitted from hand device 10 is directed against that portion 58 of the duplicate original reproduction not desired to be reproduced so as to provide an edited duplicate original reproduction 60 of undeveloped diazo compound on the material. The unexposed diazo compound on the material is then developed in apparatus that performs the second step 61 in the conventional two step process to provide an edited reproduction of the original 62.

Another method where hand held device 10 may be employed involves positioning a template 68 made from a light impermeable material on material 66 to protect a portion 64 of such material from exposure to light emitted from hand held device 10. Light emitted from hand held device 10 is then directed against a first portion 70 of material 66 coated with a light sensitive diazo compound. Template 68 is removed from edited material 72 and an original 74 is positioned on the partially exposed material 72 with the portion of the original to be removed located on the exposed portion of the material. Original 74 and partially exposed material 72 are exposed to light by using apparatus that performs the first step 75 in the conventional two step diazo process to provide an edited duplicate original reproduction 76 of undeveloped diazo compound on the material. Original 74 is separated from the exposed material 76 and the unexposed diazo compound on the material is developed in apparatus that perform the second step 77 in the conventional two step diazo process to provide a developed edited reproduction 78 of original 74.

A third method where hand held device 10 may be employed to edit a reproduction to be made by using a diazo process involves placing an original 80 to be reproduced on a material 82 coated with a light sensitive diazo compound. Original 80 and material 82 are exposed to light by using apparatus that performs the first step 83 of the conventional two step diazo process to provide a duplicate original reproduction 84 of undeveloped diazo compound on the material. Original 80 is separated from exposed material 84 and a conventional toning screen 86 is positioned on the portion of the duplicate original reproduction of undeveloped diazo compound that is to be given a tone. Light emitted from hand held device 10 is then directed through screen 86 onto the material to provide a toned reproduction 88. The toned reproduction 88 is then developed by using apparatus that performs the second step 89 of the conventional two step process and apparatus to provide a developed toned reproduction 90.

The invention having been described, what is claimed is:

1. A device for editing a reproduction to be made by using a diazo process, comprising: a portable body adapted to be hand held, said body including a tubular portion defining a chamber and a port to provide access from the chamber outwardly of said body and a handle portion connected to said tubular portion, the handle portion being adapted for a user to hold said body by hand; an electric light source disposed in the chamber of said body to provide light through the port, said electric light source having sufficient illumination to expose a light sensitive diazo compound; a reflector disposed in the tubular portion of said body to reflect light from said light source through the port in said body; light collimating means disposed in said body for providing parallel light rays passing through the port, said light collimating means including a lens system disposed in the tubular portion of said body to produce the parallel light rays; an adapter means removably connected to said body for restricting passage of light through the port, said adapter means including a member disposed in the tubular portion of said body, the member having a shoulder to restrict passage of light through the port; and electrical power means connected to said body for providing power to said electric light source, said electrical power means including switching means connected to the handle portion of said body for selectively activating and deactivating said light source such that light from said electric light source in the tubular portion of said body is directed through the port onto the light sensitive diazo compound of any undesired portion of the reproduction prior to developing the reproduction.

* * * * *